(12) United States Patent
Kuegerl et al.

(10) Patent No.: US 8,022,598 B2
(45) Date of Patent: Sep. 20, 2011

(54) PIEZOELECTRIC MULTILAYER COMPONENT HAVING A DISTURBANCE MATERIAL AND METHOD OF FORMING SAME

(75) Inventors: Georg Kuegerl, Eibiswald (AT); Oliver Dernovsek, Graz (AT); Alexander Glazunov, Deutschlandsberg (AT)

(73) Assignee: EPCOA AG, Munich (DE)

( * ) Notice: Subject to any disclaimer, the term of this patent is extended or adjusted under 35 U.S.C. 154(b) by 0 days.

(21) Appl. No.: 12/839,749

(22) Filed: Jul. 20, 2010

(65) Prior Publication Data

US 2011/0006644 A1 Jan. 13, 2011

Related U.S. Application Data

(63) Continuation of application No. PCT/EP2009/000395, filed on Jan. 22, 2009.

(30) Foreign Application Priority Data

Jan. 23, 2008 (DE) .................. 10 2008 005 680

(51) Int. Cl.
*H01L 41/083* (2006.01)
(52) U.S. Cl. ........................ 310/328; 310/365
(58) Field of Classification Search .................. 310/328, 310/365–366
See application file for complete search history.

(56) References Cited

U.S. PATENT DOCUMENTS

| 6,798,123 | B2* | 9/2004 | Bindig et al. | 310/364 |
|---|---|---|---|---|
| 6,891,109 | B2 | 5/2005 | Nishide et al. | |
| 7,358,655 | B2* | 4/2008 | Ragossnig et al. | 310/358 |
| 7,420,319 | B2 | 9/2008 | Kastl et al. | |
| 7,449,077 | B2 | 11/2008 | Heinzmann et al. | |
| 2002/0166694 | A1 | 11/2002 | Nishide et al. | |
| 2006/0055288 | A1* | 3/2006 | Heinzmann et al. | 310/364 |
| 2006/0066178 | A1* | 3/2006 | Lindner et al. | 310/328 |
| 2006/0181178 | A1 | 8/2006 | Kastl et al. | |
| 2006/0238073 | A1 | 10/2006 | Ragossnig et al. | |
| 2006/0254693 | A1 | 11/2006 | Murosawa et al. | |
| 2009/0015109 | A1 | 1/2009 | Schuh | |
| 2009/0162706 | A1 | 6/2009 | Okamura et al. | |
| 2009/0220765 | A1 | 9/2009 | Okamura et al. | |
| 2009/0289527 | A1 | 11/2009 | Hirschler et al. | |
| 2009/0295256 | A1 | 12/2009 | Okamura et al. | |
| 2010/0237751 | A1 | 9/2010 | Bosch et al. | |

FOREIGN PATENT DOCUMENTS

| DE | 102 34 787 C1 | 10/2003 |
|---|---|---|
| DE | 103 07 825 A1 | 9/2004 |
| DE | 10 2004 031 402 A1 | 2/2006 |
| DE | 10 2004 031 404 A1 | 2/2006 |
| DE | 10 2005 015 112 A1 | 10/2006 |
| DE | 10 2006 031 085 A1 | 9/2007 |
| EP | 1 717 829 A2 | 11/2006 |
| EP | 1 764 844 A1 | 3/2007 |
| EP | 1 898 476 A1 | 3/2008 |
| EP | 1 998 383 A1 | 12/2008 |
| EP | 2 003 706 A1 | 12/2008 |
| JP | 2008124276 A * | 5/2008 |

(Continued)

*Primary Examiner* — J. SanMartin
(74) *Attorney, Agent, or Firm* — Slater & Matsil, L.L.P.

(57) ABSTRACT

A piezoelectric multilayer component includes a stack of piezoceramic layers, which are arranged one on top of the other, and electrode layers. The stack has a first area and a second area. The second area contains a disturbance material, which is used to make the second area less mechanically robust than the first area.

20 Claims, 2 Drawing Sheets

FOREIGN PATENT DOCUMENTS

| | | | |
|---|---|---|---|
| JP | 2008270738 A | * | 11/2008 |
| JP | 2009054711 A | * | 3/2009 |
| JP | 2009231612 A | * | 10/2009 |
| JP | 2010034269 A | * | 2/2010 |
| WO | WO 2006/135013 A1 | | 12/2006 |
| WO | WO 2007/097460 A1 | | 8/2007 |
| WO | WO 2007/102369 A1 | | 9/2007 |
| WO | WO 2010024277 A1 | * | 3/2010 |

* cited by examiner

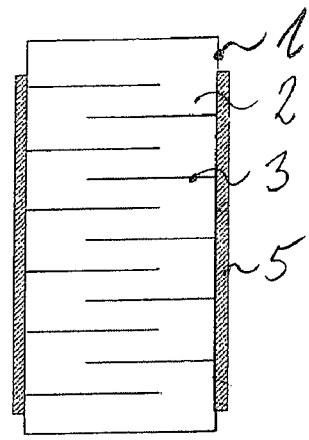
Fig. 1
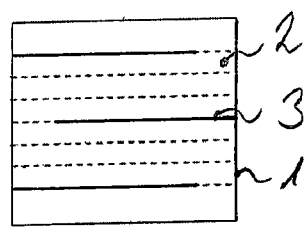
Fig. 2
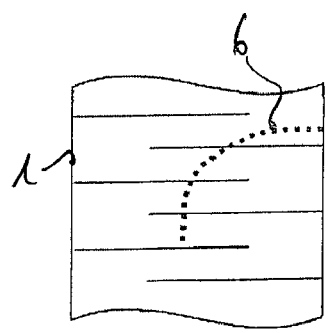 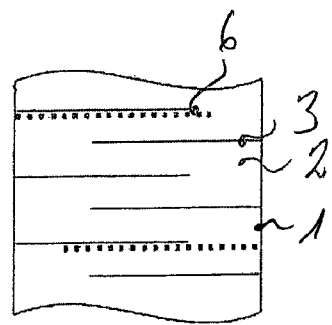
Fig. 3a    Fig. 3b

PIEZOELECTRIC MULTILAYER COMPONENT HAVING A DISTURBANCE MATERIAL AND METHOD OF FORMING SAME

This application is a continuation of co-pending International Application No. PCT/EP2009/000395, filed Jan. 22, 2009, which designated the United States and was not published in English, and which claims priority to German Application No. 10 2008 005 680.4, filed Jan. 23, 2008, both of which applications are incorporated herein by reference.

TECHNICAL FIELD

Embodiments of the invention relate to a piezoelectric multilayer component having an area of reduced mechanical robustness.

BACKGROUND

German patent document DE 10 2006 031 085 A1, and counterpart U.S. Publication 2009/0289527, disclose a piezoelectric multilayer component having weak layers.

SUMMARY

In one aspect, the present invention specifies a piezoelectric multilayer component which has a long term stability.

A piezoelectric multilayer component is specified comprising a stack of piezoceramic layers, which are arranged one on top of the other, and electrode layers which are located between them. The stack has a first area and a second area, wherein the second area contains a disturbance material, which is used to make the second area less mechanically robust than the first area.

The first area and the second area preferably each extend in the lateral direction within the stack, that is to say at right angles to the stacking direction. Both the first area and the second area run essentially parallel to the layers of the stack and preferably extend over the entire cross-sectional area of the stack.

Each of the two areas may comprise one or more of the piezoceramic layers of the stack, or may comprise only a part of one piezoceramic layer. The first area and the second area are preferably adjacent to one another.

The piezoelectric multilayer component has the advantage that mechanical stresses caused by specific mechanical loads in the stack can be relieved by controlled crack formation in the area of the reduced mechanical robustness, that is to say in the second area. In particular, this avoids two electrode layers of opposite polarity being connected to one another by a crack, since the crack is formed parallel to the layers within the second area which is less mechanically robust. For this purpose, a first area which is more mechanically robust than the second area is provided adjacent to the second area in the stacking direction. The first area is preferably composed of two subareas, which enclose the second area in the stacking direction. Cracks are therefore guided in the second area and do not propagate into the first area. This prevents short-circuits between opposite-polarity electrode layers, thus improving the long-term stability of the component.

The second area is weakened by the disturbance material. In one embodiment, the second area contains piezoceramic material, whose structure is changed by the presence of the disturbance material during the sintering process. In this case, the piezoceramic material in the second area preferably has a higher porosity than the piezoceramic material in the first area. The second area is therefore mechanically weakened.

The first area preferably likewise contains piezoceramic material, whose structure is not changed, or is changed only slightly, by disturbance material. The disturbance material may also be present in a chemical compound with the material of the second area.

Furthermore, a piezoelectric multilayer component is specified as an intermediate product, from which the described piezoelectric multilayer component can be produced. A disturbance material is introduced into the intermediate product and is suitable for changing the sintering behavior of the material in the second area so as to make the second area mechanically weaker than the first area.

The disturbance material is preferably chosen such that it can diffuse into the second area of the stack when the stack is heated, and can change the sintering behavior of the second area. However, the disturbance material may also be introduced into the second area even before the sintering process, and can change the sintering behavior of the second area. In this case, by way of example, the second area is a piezoceramic layer doped with the disturbance material. In this case, the disturbance material can change the sintering behavior of this doped layer and, furthermore, can diffuse into adjacent piezoceramic layers and also disturb their sintering behavior. The disturbance material can also be referred to as an activation material.

The disturbance material which is introduced preferably comprises a transition metal. The disturbance material may consist of the transition metal or may comprise a mixture of a transition metal with some other metal. The other metal is preferably contained in an electrode layer. This has the advantage that the number of types of metal used in the stack is minimized, therefore simplifying the production of the multilayer component. The disturbance material can also be mixed with a ceramic powder. A ceramic powder is preferably used which is also used for a piezoceramic layer.

By way of example, the disturbance material contains nickel or consists of nickel. According to one embodiment, the disturbance material is in the form of a chemical compound which comprises an oxide, hydroxide or a salt.

Instead of nickel, it is also possible to use other materials as the disturbance material, such as vanadium, chromium, manganese, iron, cobalt, zinc, gallium or germanium. These materials may be used either in the form of a metal or an alloy, or a chemical compound as mentioned above in the case of nickel.

In one embodiment of the intermediate product, at least one additional disturbance layer which contains the disturbance material is introduced into the stack.

The disturbance layer can be applied to an electrode layer. In one embodiment, the disturbance layer extends only over the electrode layer. The disturbance layer may, however, also extend over the entire cross-sectional area of the stack.

In one alternative embodiment, the disturbance layer is applied to a piezoceramic layer. The disturbance layer preferably extends over the entire cross-sectional area of the stack.

In one embodiment, the disturbance layer is structured and incompletely covers a layer of the stack. The disturbance layer may have a geometric pattern which differs from the geometry of an electrode layer. For example, the disturbance layer is composed of a disturbance material which is in the form of islands or in the form of a layer with cutouts. In this case, this may be a layer which contains the disturbance material, with the layer having an interrupted structure.

Alternatively, the disturbance layer may have the same form and/or geometry as an electrode layer. This has the advantage that electrode layers and disturbance layers can be applied in the same manner to piezoceramic layers of the stack, thus, for example, allowing the same masks to be used for printing onto these layers.

According to one embodiment, the disturbance layer extends from one longitudinal face of the stack to another longitudinal face of the stack. In particular, in this case, it can completely cover the plan area of the stack.

The disturbance layer is preferably produced by screen printing, sputtering or spraying.

According to one embodiment of the intermediate product, the disturbance layer comprises a layer in which the disturbance material is incorporated. By way of example, this is a piezoceramic layer doped with the disturbance material. In this case, the piezoceramic layer itself can be used as a weak layer. The disturbance material can also be incorporated into an electrode layer, and can diffuse into adjacent piezoceramic layers during the sintering process.

The second area is preferably adjacent to an area which contains disturbance material. When a disturbance layer is present, the second area comprises, for example, piezoceramic layers which are adjacent to the disturbance layer along the stacking direction. If a piezoceramic layer is doped with the disturbance material, then the second area comprises, for example, this piezoceramic layer. The extent to which the second area extends along the stacking direction depends primarily on the diffusion characteristics of the disturbance material, and on the amount of disturbance material.

The second area of the multilayer component is preferably composed of a piezoceramic material, in particular lead-zirconate-titanate (PZT). This material is preferably contained in a piezoceramic layer. It has been found that a ceramic material such as this which is contained in the second area can react with the disturbance material such that the mechanical strength of the second area is reduced during the heat treatment of the multilayer component, for example, during the sintering process, to such an extent that this second area can be used as a weak area or a weak layer.

Depending on the choice of the disturbance material, the porosity and the structure of the surrounding, sintered ceramic can be changed in this case. The extent of the change to a piezoceramic material in this case depends primarily on the distance to the disturbance material, the nature of the disturbance material used and on the amount of disturbance material applied.

The influence of distance of the disturbance material from the surrounding layers and the nature of the disturbance material are governed by the diffusion profile of the disturbance material through the surrounding material. The closer a piezoceramic layer is located to the disturbance material, the more disturbance material will diffuse into the piezoceramic layer during the sintering process, and the greater the extent to which the sintering behavior of the piezoceramic layer is influenced by the disturbance material. In consequence, the crack-determining influence or the influence on the porosity and the structure after completion of the sintering process is also dependent on the distance between the piezoceramic layer and the disturbance material in the intermediate product.

In the extreme, there may even be no change to the porosity and structure in piezoceramic layers which are a long distance away from the disturbance layer, because the disturbance material and the disturbance layer cannot reach these layers by diffusion processes during the sintering process. The first area of the stack, whose mechanical robustness is increased in comparison to the second area, is preferably further away from the disturbance material than the second area. The first area therefore contains smaller amounts of the disturbance material than the second area, and is therefore unchanged, or changed only slightly, in its sintering behavior.

In addition to the distance between individual piezoceramic layers and the disturbance layer, the amount of disturbance material in the disturbance layer also plays a role. In addition to influencing the diffusion profile, this amount influences the concentration of the first material in the sintered ceramic. If the amount is small, the change in the porosity and structure after completion of the sintering process will likewise be small.

At the end of the sintering process, a stack is formed having an inhomogeneous porosity distribution and inhomogeneous structure, which leads to a distribution of different mechanical strengths in the body of the stack. By way of example, some piezoceramic layers are mechanically less strong than others. Piezoceramic layers with reduced mechanical robustness are preferably located adjacent to the disturbance layer. The cracks during poling and operation of the stack are in this case preferably created in piezoceramic layers which are less strong. Since the adjacent layers are more mechanically strong, cracks such as these should propagate only within layers which are less strong. The crack profile then runs essentially parallel to the electrode layers, leading to the life of the piezoelectric multilayer component being extended.

In order to ensure that the cracks do not depart from the plane of the electrode layers during poling and during operation of the stack or of the piezoelectric multilayer component, the porosity and structure of the entire plan area of the multilayer component are preferably changed, and not just locally, for example, just at the edge of the multilayer component. In order to achieve this, the disturbance layer can extend over the entire cross-sectional area of the stack.

In addition, a method is specified for producing a piezoelectric multilayer component, wherein the piezoelectric multilayer component, which is produced as an intermediate product, is sintered. During the sintering, the disturbance material changes the sintering behavior of the material in the second area, thus mechanically weakening the second area. In this case, the disturbance material may be located in the second area even before the stack is heated, or may diffuse into the second area only during heating.

The disturbance layer is preferably produced by means of one of the already mentioned techniques and is formed with a pattern of the type already mentioned.

BRIEF DESCRIPTION OF THE DRAWINGS

The described subjects will be explained in more detail with reference to the following figures and exemplary embodiments, in which:

FIG. 1 shows a longitudinal section through a schematically illustrated piezoelectric multilayer component;

FIG. 2 shows a longitudinal section through an area of a schematically illustrated piezoelectric multilayer component;

FIGS. 3a and 3b show various crack formations in a piezoelectric multilayer component;

Figure 4:
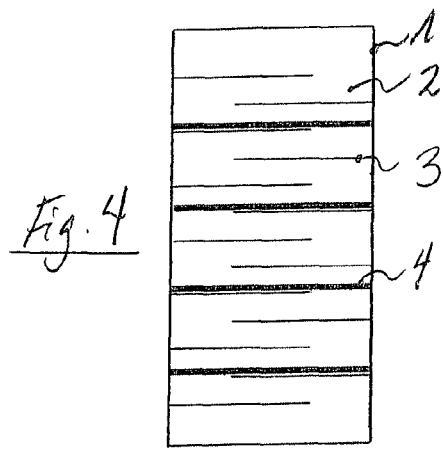
FIG. 4 shows a longitudinal section through a piezoelectric multilayer component having disturbance layers.

The following list of reference symbols can be used in conjunction with the drawings:
- 1 Stack of piezoceramic layers and electrode layers
- 2 Piezoceramic layer
- 2a Piezoceramic layer with disturbance material
- 3 Electrode layer
- 3a Electrode layer with disturbance material
- 4 Disturbance layer
- 4a Islands
- 4b Cutouts
- 4c Network structure
- 4d Areas in the form of frames
- 5 External contact
- 6 Crack
- A Second area
- B First area

DETAILED DESCRIPTION OF ILLUSTRATIVE EMBODIMENTS

FIG. 1 shows a cross section through a schematically illustrated piezoactuator, which comprises a stack 1 of piezoceramic layers 2 and electrode layers 3 located between them. External contacts are applied as external metallizations 5 to two longitudinal faces of the stack 1 and make contact with those ends of the electrode layers 3 which are led to these longitudinal faces. Adjacent electrode layers of different polarity overlap in an orthogonal projection (which runs parallel to the stack axis of the piezoactuator). An electrical field in the overlap area, which can be referred to as active zone, leads to a piezoceramic layer 2 which is present between these electrode layers being deflected or stretched. The area in which opposite-pole, adjacent electrode layers 3 do not overlap is referred to as an inactive zone. In this area, the piezoelectric effect results in virtually no deflection. The material in the electrode layers 3 is chosen such that they do not melt excessively during the sintering process and such that the structure of the printed-on electrode layer remains substantially unchanged during and after the sintering process.

FIG. 2 shows a section of a stack 1 of a piezoactuator in which a plurality of piezoceramic layers 2 can be stacked one on top of the other between opposite-pole, adjacent electrode layers 3. A section such as this is also used as a base for construction for embodiments of a piezoactuator which will be described in the following text, because disturbance layers can be applied between the additional piezoceramic layers 2 which initiate chemical reactions in order to produce a mechanically weakened second area of the stack.

FIG. 3a shows how a crack 6 connects a plurality of electrode layers 3, in particular opposite-pole electrode layers 3 in a piezoactuator.

The inventors have found that the reliability of a piezoactuator is critically dependent on coping with any cracks that occur. During thermal processes, for example, during sintering (at temperatures between 800° C. and 1500° C.), metallization and soldering and during the polarization of the (sintered) piezoactuator, the different strain that occurs in the active (driven) and inactive (isolating) zones results in mechanical stresses which lead to so-called strain-relief cracks and/or poling cracks in the piezoactuator. These run along in the inactive zone or in an electrode layer 3. These cracks can bend at the transition to the active area. If these cracks in this case bridge at least two electrode layers, short circuits can occur which can lead to failure of the piezoactuator. Cracks which run parallel to the inner electrodes in contrast represent virtually no risk to the life cycle of piezoactuators.

FIG. 3b shows a safe profile of a crack 6 in the stack 1 of a piezoactuator. The crack runs substantially parallel to an electrode layer 3 and to a piezoceramic layer 2, as a result of which the crack does not connect opposite-polarity electrode layers, and therefore also does not cause any short circuits.

FIG. 4 now shows a piezoactuator as an intermediate product, in which a plurality of disturbance layers 4 are distributed over the height of the stack 1. As disturbance material, the disturbance layers 4 may contain transition metals, such as nickel, each applied to an electrode layer 3. The disturbance layers 4 in this case extend over the entire cross-sectional area of the stack 1.

Nickel may be present as a disturbance material in various forms, for example, as metallic nickel, nickel oxide, nickel hydroxide or nickel salt. The material containing nickel can be mixed with a piezoceramic powder and can be applied to an existing layer in the stack. Powder composed of the same piezoelectric ceramic as that used for the piezoceramic layers is preferably used here. The material containing nickel may instead of this also be mixed with a metallic powder, and may be applied to an existing layer of the stack. The same metallic material is preferably used here as that used in the electrode layers of the stack. These materials comprise, for example, copper, silver, palladium or an alloy of these metals. When an electrode layer is acting as a disturbance layer, the disturbance material can be added to the paste for printing the electrode layer.

FIG. 4 shows how a disturbance layer 4 is in each case applied to an electrode layer 3. The disturbance layer 4 can be arranged at various points in the stack. For example, it can be located directly on an electrode layer 3, as is shown in FIG. 4. The disturbance layer may, however, also be applied between two piezoceramic layers 2 which are adjacent in the stacking direction, and between which there is no electrode layer 3.

The preferably thin disturbance layer 4, which has a thickness of up to 10 μm, and is composed of material containing nickel, can react with a surrounding piezoceramic during the sintering of the stack 1, and thus changes the sintering behavior of the piezoceramic.

With respect to the ceramic material which is adjacent to the disturbance layer in the ceramic layers, which are each arranged between two adjacent inner electrodes, when nickel is used as disturbance material, the nickel content is 0.05 to 10 mol %, preferably 0.5 to 6 mol %, of the piezoceramic material.

If a piezoceramic layer is doped with the first material, the abovementioned amount is understood as an additional amount above the nickel content that is present in the ceramic.

The distance between two respective disturbance layers which are adjacent in the stacking direction is preferably between 0.5 and 5 mm, preferably between 0.6 and 2.5 mm.

Figure 5A:
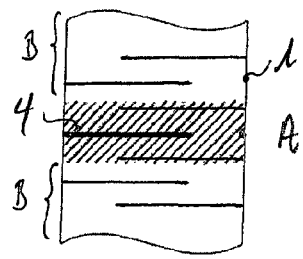
FIGS. 5a and 5b each show a longitudinal section through a piezoelectric multilayer component having an area whose robustness is reduced because of a disturbance material.

FIG. 5a shows a shaded second area A, which is mechanically weaker than a first area B, because of the disturbance material. During the sintering process, the disturbance material has diffused out of the disturbance layer 4 into the adjacent piezoceramic layers, and has lead to a disturbance in the sintering behavior. Since the first area B is further away from the disturbance layer 4, less disturbance material diffuses into this area. The first area B surrounds the second area A in the stacking direction.

Figure 5B:
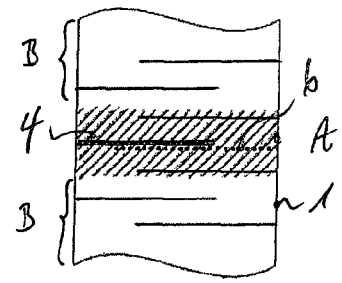

FIG. 5b shows how a controlled crack 6 can be formed through this first area A when the stack is mechanically loaded. The crack 6 runs within the first area A in the vicinity of the disturbance layer 4 that is applied in the intermediate product. This is because of the fact that the piezoceramic layer becomes weaker the closer it is to the disturbance layer 4. The mechanical robustness of the piezoceramic layers can decrease continuously in the direction of increasing distance from the disturbance layer 4. The transition between the second area A and the first area B can therefore also have a smooth profile.

FIGS. 6a to 6d show various arrangement options for disturbance material in an intermediate product.

Figures 6A, 6B, 6C, 6D:
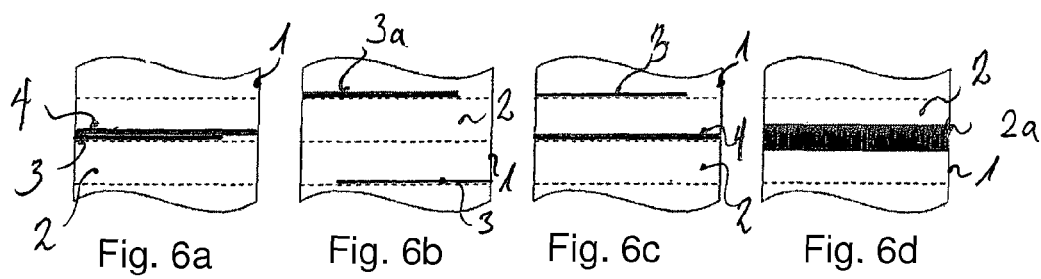
FIGS. 6a to 6d show various embodiments of a disturbance layer.

FIG. 6a shows a disturbance layer 4 which is applied to an electrode layer 3. In contrast to the electrode layer 3, the disturbance layer 4 extends over the entire cross section of the stack.

FIG. 6b shows an electrode layer 3a into which disturbance material is introduced. The disturbance material is in this case not introduced into all the electrode layers 3.

FIG. 6c shows how a disturbance layer 4 runs over the entire cross section of the stack 1 and is applied to a piezoceramic layer 2.

FIG. 6d shows a piezoceramic layer 2a doped with disturbance material. During the sintering process, the disturbance material changes the sintering behavior of this piezoceramic layer 2a, and can furthermore also diffuse into further, adjacent piezoceramic layers 2, and disturb their sintering behavior.

Figures 7A, 7B, 7C, 7D:
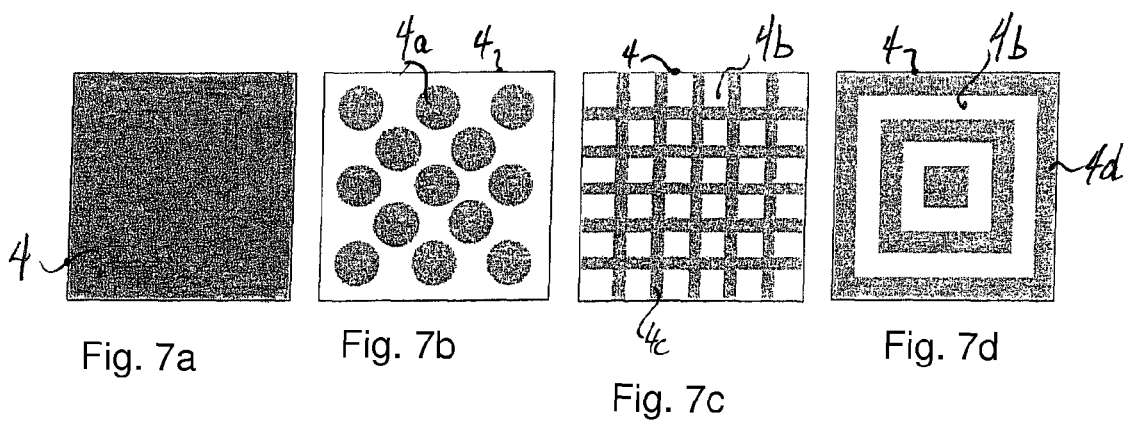
FIGS. 7a to 7d show plan views of disturbance layers with different geometric patterns.

FIG. 7a shows a plan view of a disturbance layer 4 which covers the entire cross-sectional area of the stack. By way of example, the disturbance layer 4 covers a piezoceramic layer 2 or an electrode layer 3.

FIG. 7b shows a plan view of a disturbance layer 4 which is in the form of an arrangement of islands 4a which cover only a portion of the surface of a layer 2, 3 of the stack. In this case, the islands 4a are circular, but they may each have any other desired outline, for example, a polygonal outline. The islands 4a are preferably applied in a regular pattern to a layer 2, 3 of the stack 1, in such a way that they are each at the same distances from one another. A regular structure such as this is, however, not an absolute requirement. Preferably, the islands 4a are distributed uniformly over the cross-sectional area of the stack 1.

FIG. 7c shows a disturbance layer 4 which is applied as a network structure 4c to a layer 2, 3 of the stack. The disturbance material is therefore arranged on the layer 2, 3 in a cohesive structure which encloses square cutouts 4b.

FIG. 7d shows a disturbance layer 4 which is applied to a layer 2, 3 of the stack as an arrangement of concentric areas 4d, in the form of frames, of the disturbance material. These areas of the disturbance material may in this case have circular or square outlines. They may be considered to be islands which are in the form of frames and have a common center.

The disturbance layers shown in the above figures can preferably be seen not only in the intermediate product but also in the end product, as well.

Preferred material compositions as well as structures of a piezoelectric multilayer component with disturbance layers will be specified in the following text. In this case, any desired combinations of the materials mentioned in the embodiments, and of the arrangement of the disturbance material, are also feasible.

By way of example, the piezoceramic layers contain a ceramic with a composition according to the following formulae:

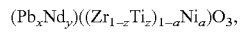

$(Pb_xNd_y)((Zr_{1-z}Ti_z)_{1-a}Ni_a)O_3$, where $0.90 \leq x \leq 1.10$;
$0.0001 \leq y \leq 0.06$;
$0.35 \leq z \leq 0.60$;
$0 \leq a \leq 0.10$.

According to a first embodiment, the disturbance material comprises a paste containing nickel oxide with an organic binding agent. The disturbance layer is applied to an electrode layer by screen printing. The concentration of the nickel applied to the electrode layer is between 0.5 and 6 mol % with respect to the piezoceramic of adjacent layers or adjacent piezoceramic layers. The distance between two adjacent disturbance layers in the stacking direction is between 0.6 and 2.5 mm. The disturbance layer is applied to the entire area of an electrode layer and extends over the entire cross-sectional area of the stack. The electrode layers preferably contain exclusively copper as metal.

According to a further embodiment, the substance containing nickel comprises a powder mixture of an alloy of nickel and copper with an organic binding agent. The disturbance material is in this case added to an electrode layer. The electrode layer is produced by screen printing. The concentration of the applied nickel is between 0.5 and 6 mol % with respect to the piezoceramic of adjacent piezoceramic layers. The distance between two adjacent disturbance layers in the stacking direction is between 0.6 and 2.5 mm. The shape of the electrode layer containing nickel corresponds to the shape of further electrode layers, which contain exclusively copper as metal.

According to a further embodiment, the substance containing nickel comprises a paste containing nickel oxide and copper with an organic binding agent. The disturbance material is also added in this case to an electrode layer which is applied by means of screen printing. The concentration of the applied nickel is between 0.5 and 6 mol % with respect to the piezoceramic of adjacent piezoceramic layers. The distance between two adjacent disturbance layers in the stacking direction is between 0.6 and 2.5 mm. The shape of the electrode layer containing nickel corresponds to the shape of further electrode layers which contain exclusively copper as metal.

What is claimed is:

1. A piezoelectric multilayer component, comprising:
   a stack of green piezoceramic layers arranged one on top of the other;
   electrode layers located between the piezoceramic layers; and
   a disturbance material disposed in a second area of the stack but not in a first area of the stack, the disturbance material being suitable for changing a sintering behavior of material in the second area of the stack so as to make the second area mechanically weaker than the first area of the stack, wherein the disturbance material comprises a transition metal and/or a chemical compound that is an oxide, a hydroxide, or a salt and wherein the second area contains a piezoceramic material.

2. The multilayer component as claimed in claim 1, wherein at least one disturbance layer that contains the disturbance material is incorporated in the stack.

3. The multilayer component as claimed in claim 2, wherein the disturbance layer is applied on an electrode layer.

4. The multilayer component as claimed in claim 2, wherein the disturbance layer is applied on a piezoceramic layer.

5. The multilayer component as claimed in claim 2, wherein the disturbance layer is structured and incompletely covers a layer of the stack.

6. The multilayer component as claimed in claim 1, wherein a piezoceramic layer is doped with the disturbance material.

7. The multilayer component as claimed in claim 1, wherein the disturbance material is introduced into an electrode layer.

8. The multilayer component as claimed in claim 1, wherein the disturbance material extends over a cross-sectional area of the stack.

9. The multilayer component as claimed in claim 1, wherein the second area comprises parts of a piezoceramic layer that are adjacent to the disturbance material.

10. A method for producing a piezoelectric multilayer component, the method comprising:
    providing an intermediate product that comprises a stack of green piezoceramic layers arranged one on top of the other and electrode layers located between the piezoceramic layers, the intermediate product further including a disturbance material disposed in a second area of the stack but not in a first area of the stack, wherein the disturbance material comprises a transition metal and/or a chemical compound that is an oxide, a hydroxide, or a salt and wherein the second area of the stack contains a piezoceramic material; and
    sintering the intermediate product, wherein, during the sintering, the disturbance material changes the sintering behavior of the material in the second area of the stack so as to make the second area mechanically weaker than a first area of the stack.

11. The method of claim 10, wherein the multilayer component comprises the stack of piezoceramic layers and the electrode layers, wherein the second area is less mechanically robust than the first area.

12. The method as claimed in claim 11, wherein there is piezoceramic material in the first area, and a structure of the piezoceramic material in the second area is changed in comparison to a structure of the piezoceramic material in the first area during the sintering.

13. The method as claimed in claim 11, wherein the first area of the stack contains a piezoceramic material and wherein the piezoceramic material in the second area has a higher porosity than the piezoceramic material in the first area.

14. A method of producing a piezoelectric multilayer component, the method comprising:
    arranging a stack of green piezoceramic layers one on top of the other;
    arranging electrode layers between the piezoceramic layers;
    disposing a disturbance material in places in the stack, wherein the disturbance material comprises a transition metal and/or a chemical compound that is an oxide, a hydroxide, or a salt and wherein the places in the stack contain a piezoceramic material; and
    heating the stack of piezoceramic layers and electrode layers such that the disturbance material causes a second area to be mechanically weaker than a first area of the stack.

15. The method as claimed in claim 14, wherein disposing the disturbance material comprises applying the disturbance material on an electrode layer.

16. The method as claimed in claim 14, wherein disposing the disturbance material comprises applying the disturbance material on a piezoceramic layer.

17. The method as claimed in claim 14, wherein disposing the disturbance material comprises arranging a disturbance layer in the stack.

18. The method as claimed in claim 17, further comprising structuring the disturbance layer.

19. The multilayer component as claimed in claim 1, wherein the disturbance material comprises a transition metal.

20. The multilayer component as claimed in claim 1, wherein the disturbance material comprises a chemical compound that is an oxide, a hydroxide, or a salt.

* * * * *